US006376284B1

(12) United States Patent
Gonzalez et al.

(10) Patent No.: US 6,376,284 B1
(45) Date of Patent: Apr. 23, 2002

(54) METHOD OF FABRICATING A MEMORY DEVICE

(75) Inventors: Fernando Gonzalez; Gurtej S. Sandhu; Mike P. Violette, all of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/570,614

(22) Filed: May 12, 2000

Related U.S. Application Data

(62) Division of application No. 08/604,751, filed on Feb. 23, 1996.

(51) Int. Cl.[7] .............................................. H01L 21/82
(52) U.S. Cl. ........................ 438/129; 438/237; 438/599
(58) Field of Search ................................. 438/129, 237, 438/FOR 189, FOR 212, 599

(56) References Cited

U.S. PATENT DOCUMENTS

| | | | |
|---|---|---|---|
| 4,677,742 A | * | 7/1987 | Johnson |
| 4,796,074 A | | 1/1989 | Roesner |
| 4,818,717 A | * | 4/1989 | Johnson et al. |
| 4,868,616 A | * | 9/1989 | Johnson et al. |
| 4,902,377 A | | 2/1990 | Berglund et al. |
| 4,910,168 A | | 3/1990 | Tsai |
| 4,948,755 A | * | 8/1990 | Mo |
| 5,166,758 A | | 11/1992 | Ovshinsky et al. |
| 5,379,250 A | | 1/1995 | Harshfield .................. 365/105 |
| 5,392,237 A | | 2/1995 | Iida |
| 5,426,321 A | | 6/1995 | Hyodo |
| 5,534,730 A | | 7/1996 | Mori et al. |
| 5,576,572 A | | 11/1996 | Maeda et al. |
| 5,596,522 A | | 1/1997 | Ovshinsky et al. |
| 5,646,879 A | | 7/1997 | Harshfield .................. 365/105 |
| 5,700,706 A | | 12/1997 | Juengling |
| 5,818,749 A | * | 10/1998 | Harshfield |
| 5,835,409 A | | 11/1998 | Lambertson |
| 5,841,150 A | | 11/1998 | Gonzalez et al. |

OTHER PUBLICATIONS

Flidlider et al., Permanent store semiconductor memory unit, Apr. 1981, Derwent Information LTD, 1982–09686E.*

* cited by examiner

Primary Examiner—George Fourson
Assistant Examiner—Thanh V Pham
(74) Attorney, Agent, or Firm—Fletcher, Yoder & Van Someren

(57) ABSTRACT

A memory device wherein a diode is serially connected to a programmable resistor and is in electrical communication with a buried digit line. An electrically conductive plug is electrically interposed between the digit line and a strapping layer, thereby creating a double metal scheme wherein the strapping layer is a second metal layer overlying metal wordlines. In a method of a first embodiment the strapping material is electrically connected to the digit line through a planar landing pad overlying the conductive plug. An insulative material is sloped to the planar landing pad in order to provide a surface conducive to the formation of the strapping material. In a method of a second embodiment diodes are formed, each having a maximum width equal to f, which is equal to the minimum photolithographic limit of the photolithographic equipment being used, and distanced one from the other along a length of the digit line by a maximum distance equal to f; at least portions of the diodes are masked; at least a portion of an insulative material interposed between two diodes is removed to expose the buried digit line; and the conductive plug is formed in contact with the exposed portion of the buried digit line. After the formation of a programmable resistor in series with the diode a wordline is formed in electrical communication with each of the programmable resistors, and an insulative layer is formed overlying each wordline. Next an insulative spacer layer is deposited and etched to expose the conductive plug. The strapping layer is then formed overlying and in contact with the conductive plug.

14 Claims, 17 Drawing Sheets

METHOD OF FABRICATING A MEMORY DEVICE

This appln is a Div. of Ser. No. 08/604,751 filed Feb. 23, 1996

The present invention relates generally to semiconductor devices; and more particularly relates to methods for forming digit lines of improved conductivity, such method having particular usefulness in the fabrication of memory devices, and particularly to memory devices having programmable elements accessible by a diode.

BACKGROUND OF THE INVENTION

Diode arrays are well known memory storage arrays used in semiconductor memory devices. A selected diode is typically addressed via digit line and word line selection. A resistance of a programmable resistor in series with the selected diode is controlled to select a desired memory state. In one case the programmable resistor may be an ovonic element, such as a chalcogenide material. The internal structure of the chalcogenide is modified to alter its resistance and therefore its "logic" state. The modification of the structure is ovonic and is dependent on the current which is applied to the element through the diode. It is desirable to reduce stray resistance which may be in series with the diode, since by reducing the stray resistance the ovonics can be more closely controlled with less current, thereby reducing power requirements.

SUMMARY OF THE INVENTION

The invention includes a method for forming a semiconductor device wherein a conductive element within the substrate is strapped by another conductive layer above. In one currently envisioned embodiment, another conductive layer will be interposed between the substrate and the strapping layer. In one exemplary preferred implementation, the semiconductor device will be a memory device comprising a diode serially connected to a programmable resistor. The diode is in electrical communication with a buried digit line. An electrically conductive plug is electrically interposed between the digit line and a strapping layer, thereby creating a double metal structure wherein the strapping layer is a second metal layer overlying metal wordlines.

In a method of a first embodiment, the strapping material is electrically connected to the digit line through a planar landing pad overlying the conductive plug. An insulative material is sloped to the planar landing pad in order to provide a surface conducive to the formation of the strapping material. Typically a layer of titanium silicide is formed on the buried digit line.

In an exemplary method of forming a second embodiment in accordance with the present invention, diodes are formed, each having a maximum width equal to f, which may be equal to the minimum photolithographic limit of the photolithographic equipment being used, and distanced one from the other along a length of the digit line by a maximum distance equal to f; at least portions of the diodes are masked; at least a portion of an insulative material interposed between two diodes is removed to expose the buried digit line; and the conductive plug is formed in contact with the exposed portion of the buried digit line. After the formation of a programmable resistor in series with the diode a wordline is formed in electrical communication with each of the programmable resistors, and an insulative layer is formed overlying each wordline. Next an insulative spacer layer is deposited and etched to expose the conductive plug. The strapping layer is then formed overlying and in contact with the conductive plug.

In the second embodiment the width of the diode is equal to f and the electrically conductive plug is formed within a distance f from a sidewall of the diode. An electrically insulative spacer is interposed between the plug and the sidewall of the diode. In this embodiment the diode and the plug are made of polycrystalline silicon, although it is possible to use any conceivable diode structure, for example a metal/semiconductor. In the second embodiment the cathode of the diode is fabricated in the substrate and the anode is fabricated overlying the substrate or vice versa.

In the typical memory array of the invention the programmable resistor is ovonic and the array is a mesa type structure. The diodes are either planar or container structures.

The invention provides redundancy since the digit line is a buried component and the strapping layer is an upper component. Thus, even if the metal of the strapping layer breaks, operation of the memory device is maintained through the buried digit line. Thus the device has better electromigration reliability, and there is no memory disturbance from cell to cell due to the collection of current in the digit line.

There is space savings when using the structure of the second embodiment, since the area between cells is no longer just isolation space but is used instead for contact to the buried digit line, thereby providing efficient spacing of the cell for high compaction while at the same time. providing good cell to cell isolation.

By using the double metal scheme of the invention the series resistance to the diode is reduced to the diode/prograiiuiable resistor structure. This resistance is decreased even further by providing a strapped conductive plug for every two diodes of the array and physically interposed therebetween. By using Titanium silicide on the buried digit line in conjunction with the strapped metal layer the best packing density is achieved with minimal processing steps. In addition the titanium silicide is used to minimize the number of connections needed to connect the strapping material and buried digit line.

BRIEF DESCRIPTION OF THE PREFERRED EMBODIMENTS

The invention is described in reference to the exemplary embodiment of a memory device comprising a diode serially connected to a programmable resistor. The diode is in electrical communication with a buried digit line. An electrically conductive plug is electrically interposed between the digit line and a strapping layer, thereby creating a "double metal" structure wherein the strapping layer is a second metal layer overlying metal wordlines.

In an exemplary memory array the programmable resistor includes an ovonic element and the array is a mesa type structure. Alternately, in a read only memory structure, the programmable resistor may be an anti-fuse device. The diode is either a planar or a container structure, and is used as a setting device to control current to the programmable resistor.

Figure 1A:
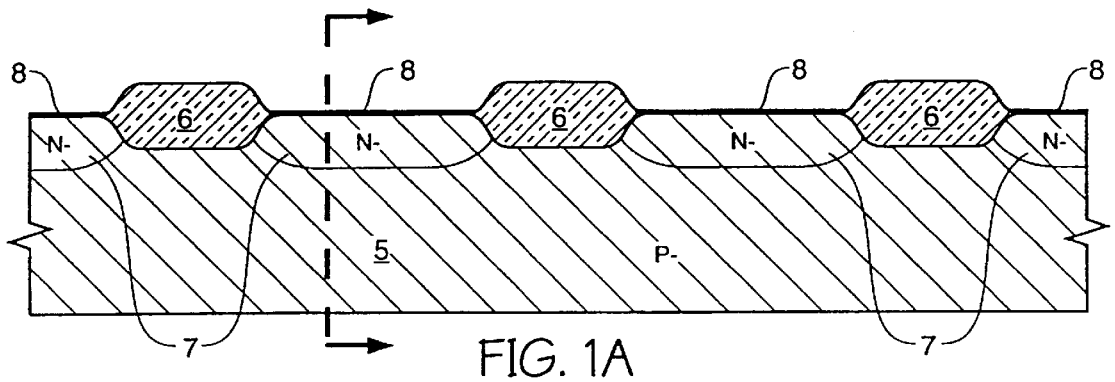
FIG. 1A is a cross sectional view of a substrate in which digit lines have been formed. The cross sectional view of FIG. 1A is taken through the width of the digit lines.

The method of the first embodiment is discussed relative to FIGS. 1A–8. FIG. 1A depicts a p-type substrate 5 which was masked with a pattern which defined active areas. Field oxide 6 was then grown to electrically isolate the active areas, and the mask was removed. The exposed portions of the substrate 5 are implanted at a dose of $1-9E^{13}$ with a dopant such as phosphorous having an energy of 100–150 KeV to create n- regions 7 in the active area of the substrate. Titanium is deposited and a RTP sinter is performed during which the titanium reacts with the exposed portions of the silicon substrate to form titanium silicide 8. Unreacted portions of the titanium are removed with a low temperature piranha etch. The titanium silicide regions 8 and the n-region of the substrate 7 form the buried digit lines 10. One of the digit lines 10 is shown in longitudinal cross-section in FIG. 1B, while FIG. 1A depicts the entire column pattern in vertical cross-section lateral to the digit lines 10.

The titanium silicide 8 remaining following the piranha etch is masked (mask not shown) to protect titanium silicide 8 in future contact areas during an etch which removes the titanium silicide 8 in unmasked regions. The masked is then removed (see FIG. 1B).

Figure 1B:
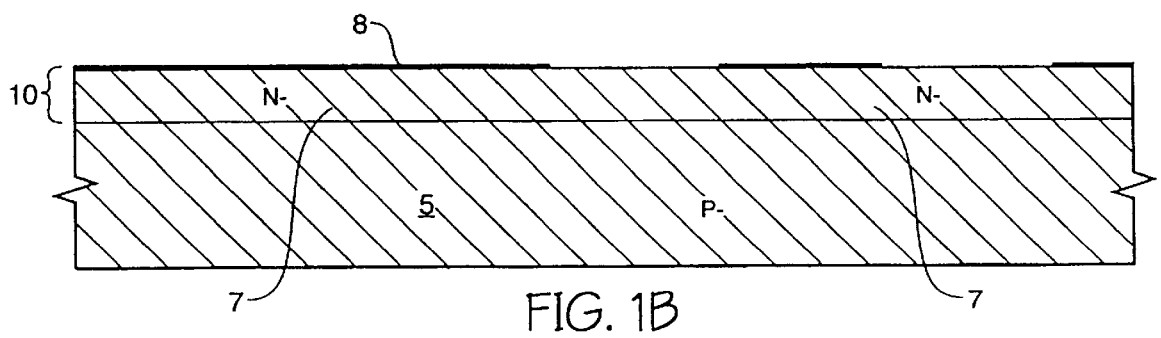
FIG. 1B is a cross sectional view taken through the length of one of the digit lines shown in FIG. 1A.
Figure 2A:
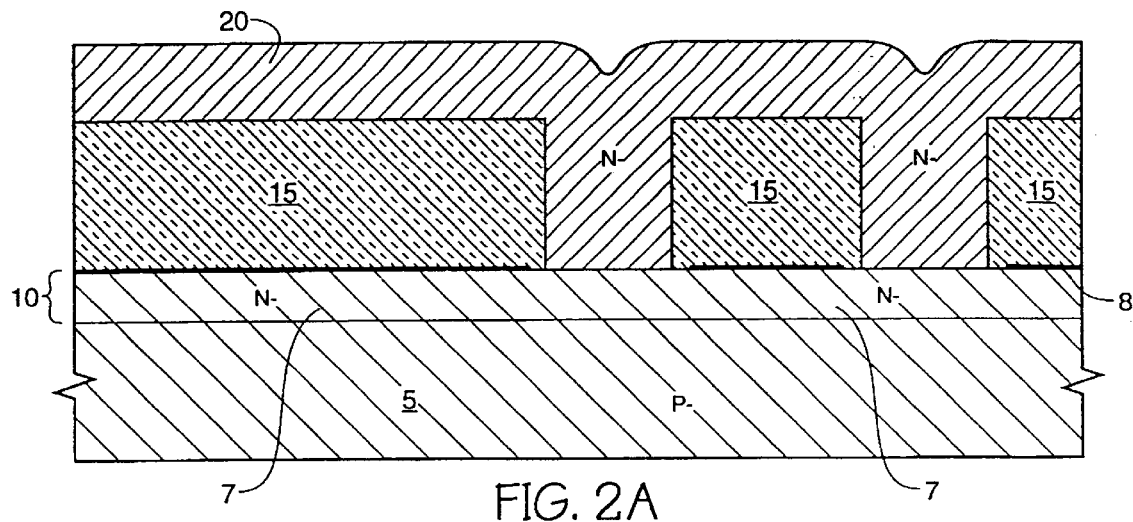
FIGS. 2A and 2B are the cross sectional view shown in FIG. 1B following depositions of silicon dioxide and polycrystalline silicon.
Figure 2B:
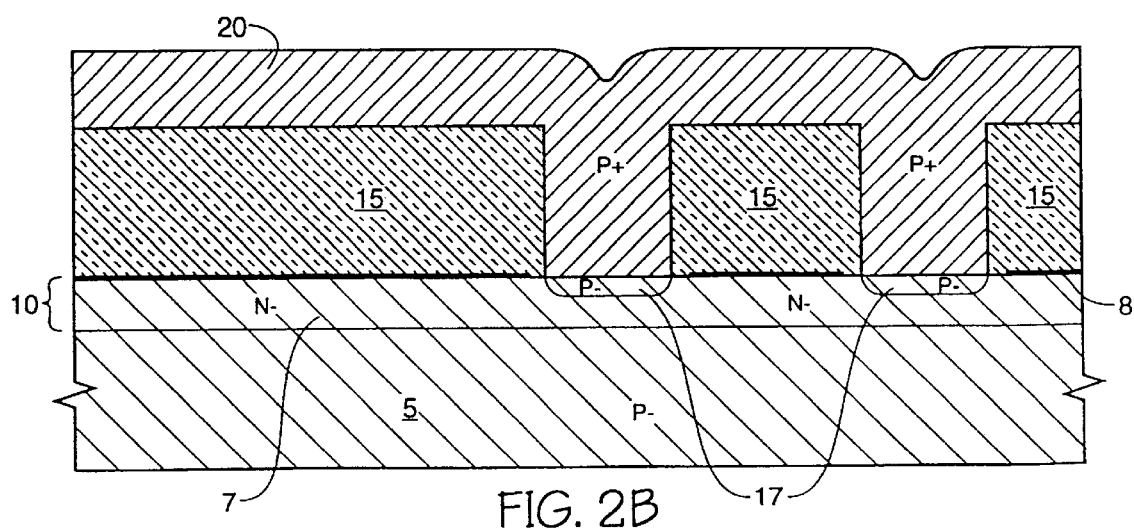

FIGS. 2A and 2B depict the cross sectional view shown in FIG. 1B following further process steps. In FIG. 2A a relatively thick layer of silicon dioxide 15 is deposited to overlie the buried digit lines 10 and the field oxide 6, which is not shown in this cross section. The silicon dioxide 15 is masked with a contact pattern, not shown, defining polycrystalline silicon plugs and etched to create openings in which the polycrystalline silicon plugs may be formed. The openings expose the digit lines 10 in contact regions. After removal of the mask a layer of polycrystalline silicon 20 is deposited to fill the openings. The polycrystalline silicon 20 is doped. The dopant is selected from materials having n-impurities such as phosphorous, antinomy, and arsenic. The dopant may be implanted at 35–150 KeV and a dose of $3E^{13}-1E^{14}$. The polycrystalline silicon 20 may be deposited in situ and doped between $1E^{16}$ and $1E^{18}$ atoms/cc or doped after the polycrystalline silicon 20 is deposited to the same dopant level.

In an alternate embodiment shown in FIG. 2B the silicon dioxide 15 is masked and etched as in FIG. 2A. Following the etch of the silicon dioxide 15 the substrate is implanted with a dopant selected from materials having p- impurities, such as boron, gallium, and $BF_2$ to form p- regions 17. The dopants have energies ranging from 50–100 KeV and dosages of $1E^{13}-1E^{14}$ atoms/cm$^2$. The polycrystalline silicon 20 is then deposited to fill the openings. In this embodiment the polycystalline silicon 20 is implanted or in situ doped with a dopant selected from materials having p+ impurities, such as boron, gallium, and $BF_2$, to create a p+ polycrystalline silicon 20. The dopants have energies ranging from 35–50 KeV and dosages of $1E^{15}$ to $5E^{15}$ atoms/cm$^2$.

Figure 3A:
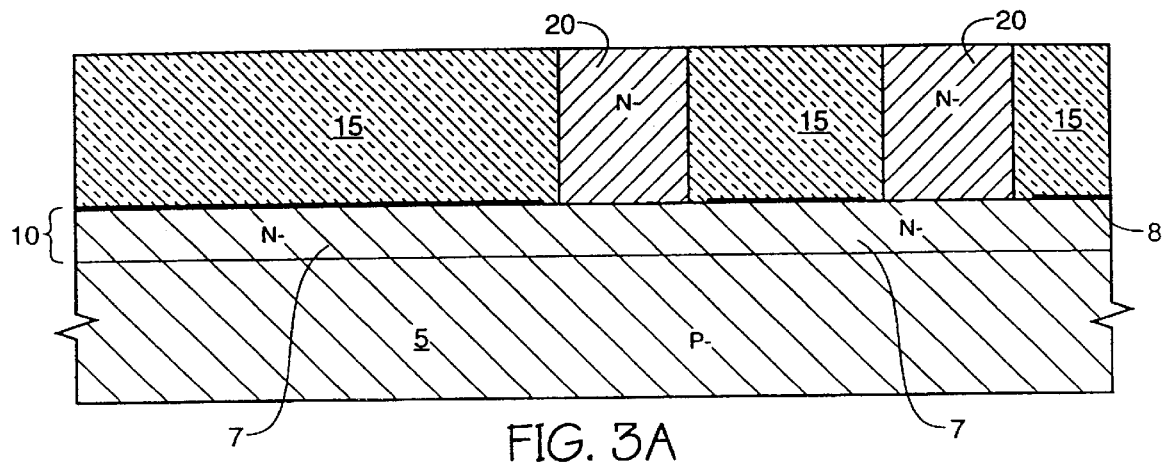
FIGS. 3A and 3B are the cross sectional views shown in FIGS. 2A and 2B, respectively, following a CMP.
Figure 3B:
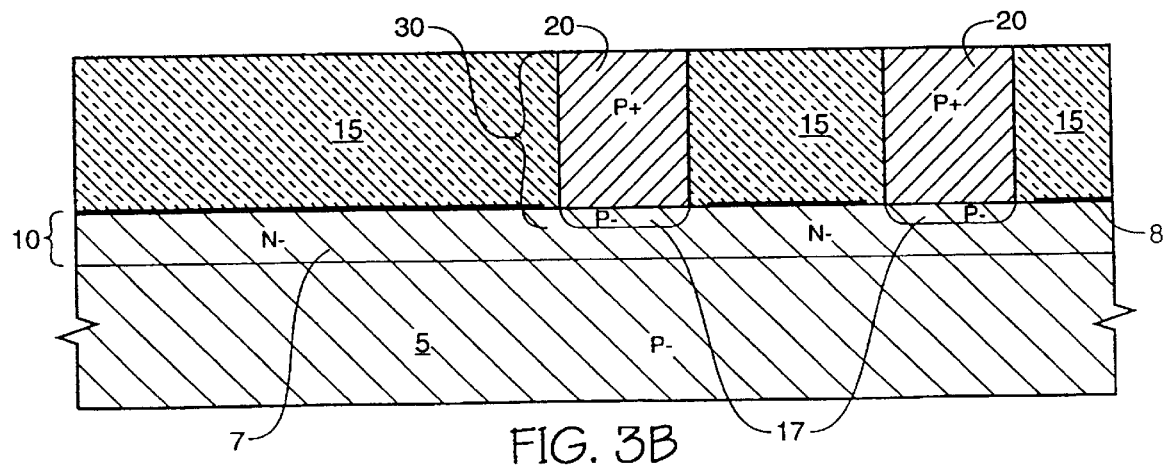

FIGS. 3A and 3B are the cross sectional views shown in FIGS. 2A and 2B, respectively, following further process steps. In FIGS. 3A and 3B the polycrystalline silicon layer 20 of FIGS. 2A and 2B, respectively, have been planarized, such as through chemical mechanical planarization (CMP) to remove portions of the polycrystalline silicon 20 overlying the silicon dioxide 15, while at the same time retaining the polycrystalline silicon 20 in the openings. The CMP is selective to the silicon dioxide 15. Thus the CMP action stops when the silicon dioxide 15 is exposed. In FIG. 3B the p+ polycrystalline silicon 20 and the p- region 17 together form a diode 30 with the digit line 10.

Figure 4:
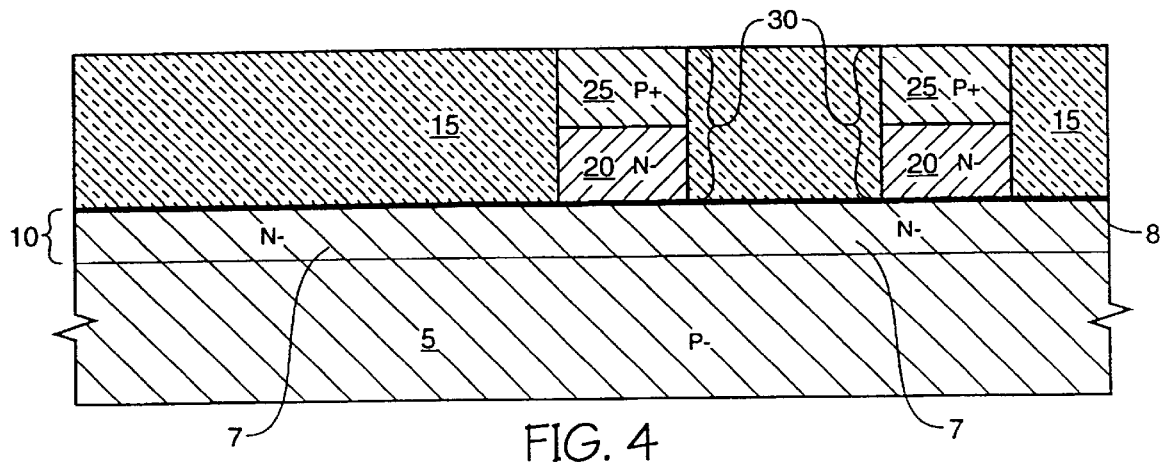
FIG. 4 is the cross sectional view of FIG. 3A following a doping of the polycrystalline silicon.

FIG. 4 is the cross sectional view of FIG. 3A following further process steps. In FIG. 4 a p+ implant and an activation cycle, which includes a rapid thermal process (RTP) cycle and hydrogen cycle, has been performed to create a p+ region 25 at an upper portion of the polycrystalline silicon 20 of FIG. 3A. During the implant typical p-type dopants, such as Boron, Gallium, and $BF_2$ are implanted at energy of 35–50 KeV and at a dosage of $1E^{15}$ to $5E^{15}$ atoms/$cm^2$. The lower portion of the polycrystalline silicon remains n– thereby forming a diode 30 vertical to the buried digit line 10. For simplicity the remaining steps of this embodiment will pertain to diode 30 of FIG. 4 although the same steps would be applicable if the diode of FIG. 3B were used instead.

Next the silicon dioxide 15 and diodes 30 are masked (mask not shown), to pattern a contact to the digit line 10. The silicon dioxide 15 is etched to form openings (not shown) to expose the digit lines 10, and the resist used for masking is removed.

Figure 5:
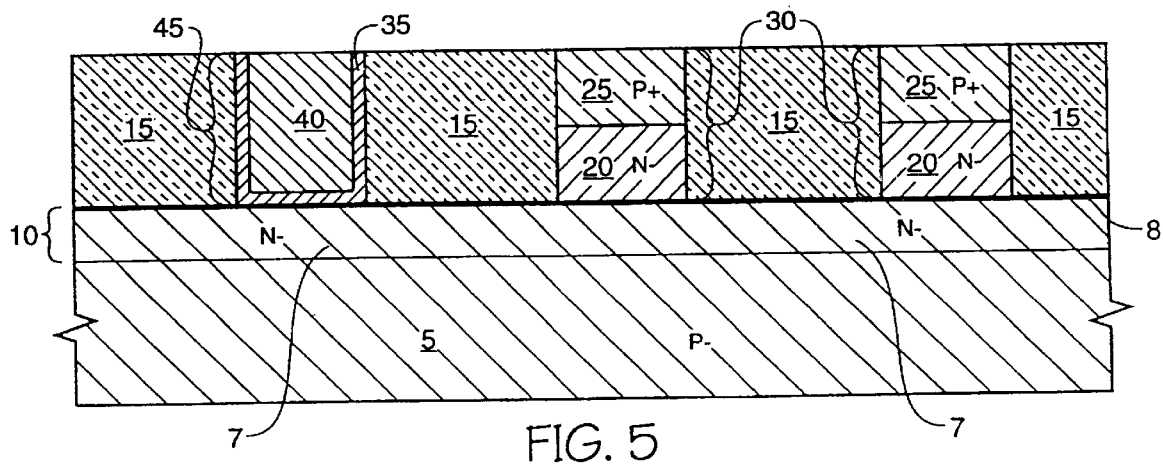
FIG. 5 is the cross sectional view of FIG. 4 following the formation of a contact plug.

FIG. 5 depicts the cross sectional view of FIG. 4 following further process steps. In FIG. 5 a thin layer of titanium and titanium nitride 35 is deposited along the sidewalls of the openings and overlying the digit lines 10. Tungsten 40 is deposited to fill the opening and to overly the titanium. The titanium and titanium nitride 35 and tungsten 40 are chemically mechanically planarized to expose the silicon dioxide 15 and form a contact plug 45.

Figure 6:
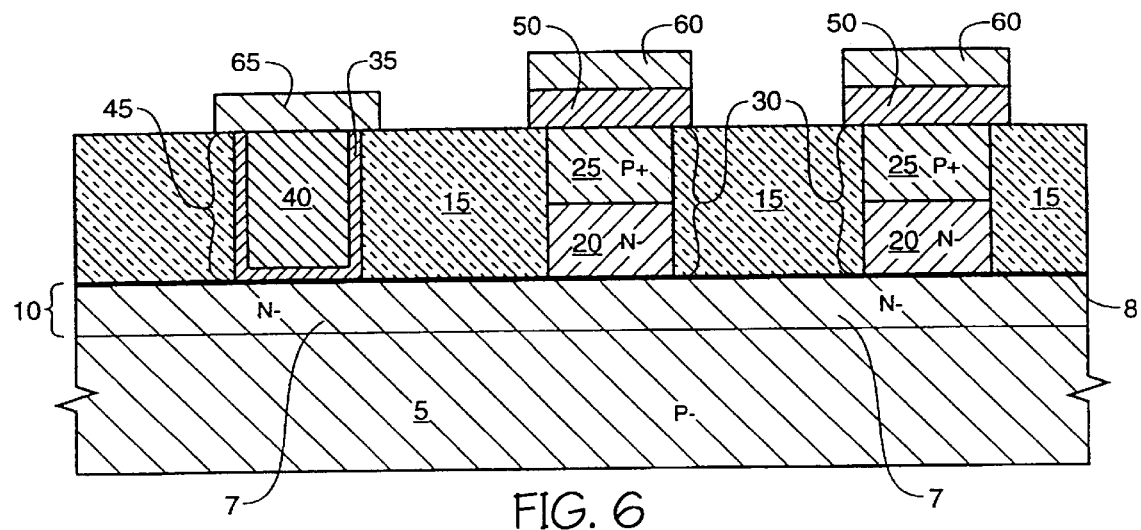
FIG. 6 is a cross sectional view of FIG. 5 following the formation of programmable resistors, word lines and a landing pad.

FIG. 6 depicts the cross sectional view of FIG. 5 following further process steps. In FIG. 6 at least one layer has been deposited masked and etched to form programmable elements 50 (such as ovonic elements or antifuse elements) overlying each diode 30. In the case where an ovonic device is formed several deposition, mask, and etch steps may be utilized to layer Titanium tungsten, carbon, a first nitride layer, chalcogenide, and a second nitride layer. Various methods can be used when forming the ovonic device.

A first metal layer or stack of approximately 5000 Angstrom is then deposited to overly the silicon dioxide 15, programmable resistors 50 and the contact plug 45. The metal layer is then patterned with a mask, not shown, and etched to form wordlines 60 in contact with the programmable resistors 50 and a planar landing pad 65 overlying the contact plug 45. The mask is then removed.

Figure 7:
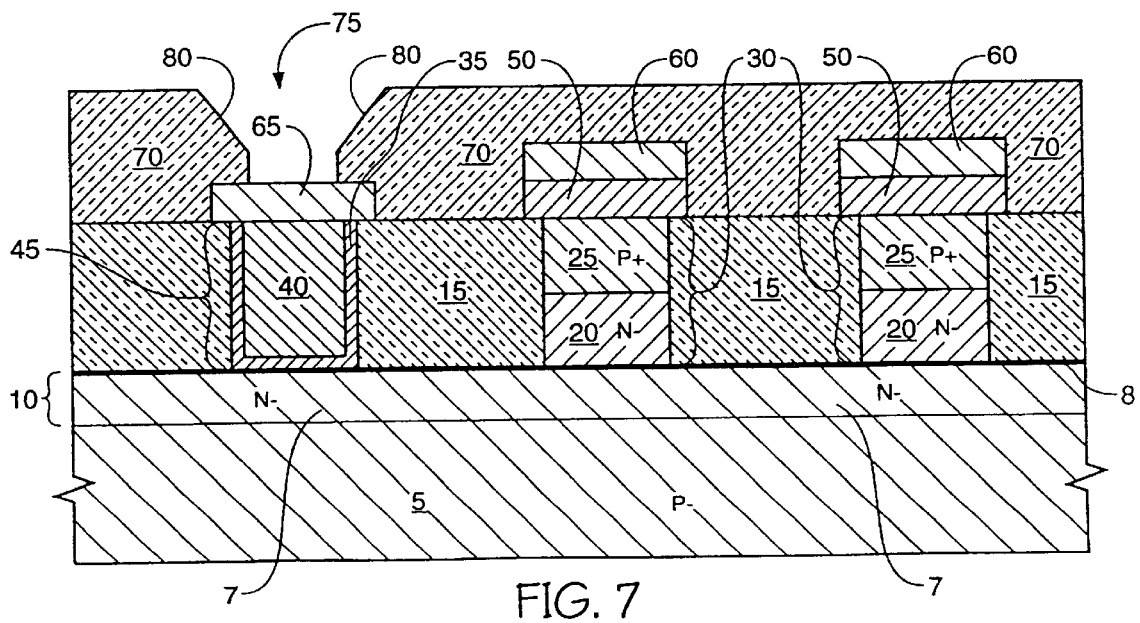
FIG. 7 is a cross sectional view of FIG. 6 following the formation and etch of an oxide layer.

FIG. 7 is a cross sectional view of FIG. 6 following further process steps. In FIG. 7 an interlevel dielectric oxide layer 70 is deposited, chemically mechanically planarized to create a planar surface, patterned, etched with a wet oxide 7:1 hydrofluoric dip for 15 seconds, and dry etched to expose the landing pad 65. The etch of the invention creates an opening 75 in the oxide 70 having a sloped sidewall 80. The direction of the slope is such that the upper portion of the opening has a larger perimeter than that of the lower portion.

Figure 8:
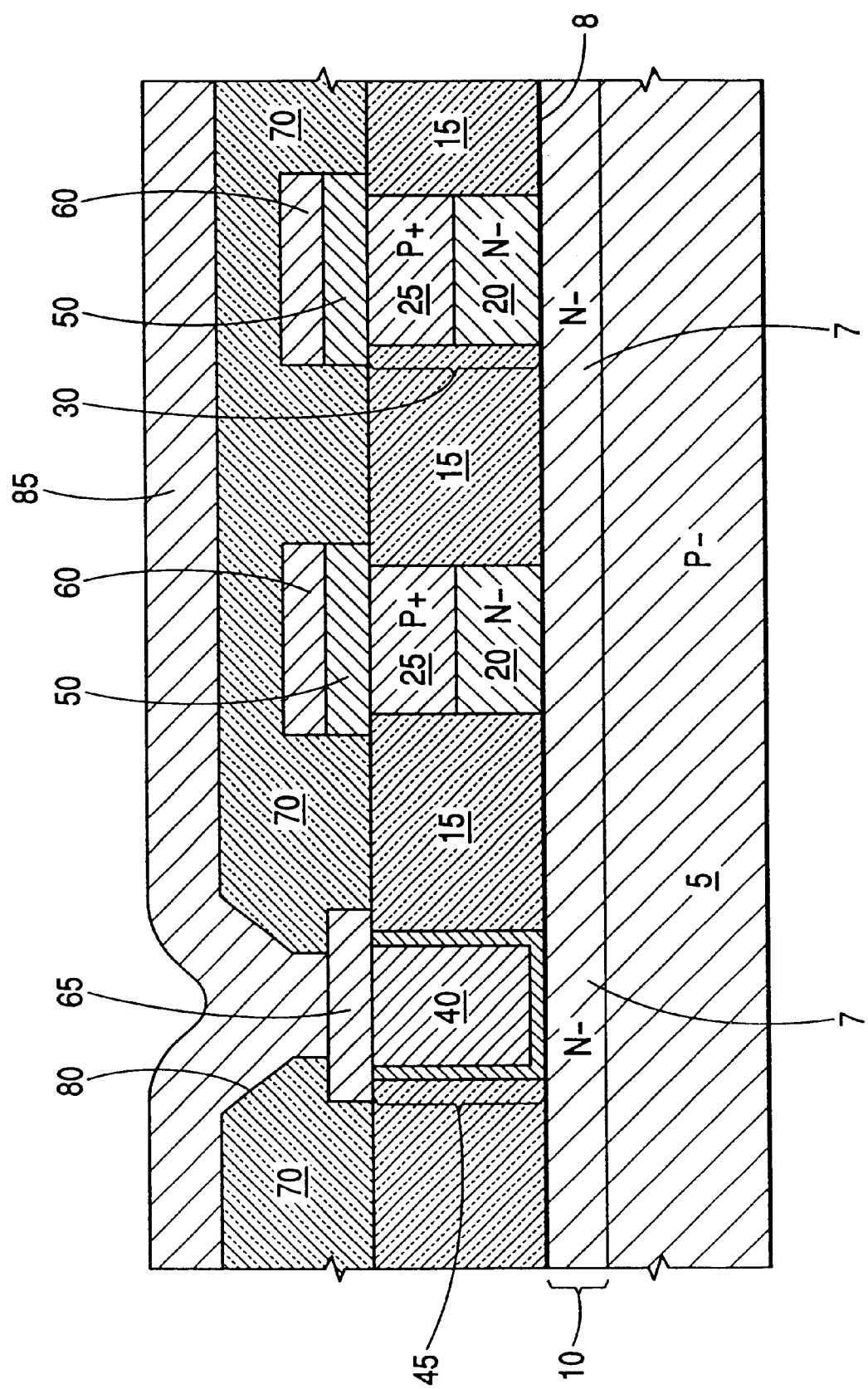
FIG. 8 is a cross sectional view of FIG. 7 following the formation of a strapping layer.

FIG. 8 is a cross sectional view of FIG. 7 following further process steps. In FIG. 8 a second metal layer or stack, which is well known to those skilled in the art, is deposited to overlie the oxide 70 and the landing pad 65. The sloped sidewalls 80 are conducive to good step coverage during the deposit of the second metal layer. Substantially vertical sidewalls 80 may be employed for tighter geometries. The second metal layer is patterned with a mask and etched to define and form a strapping layer 85. The mask is then removed. Although this cross section shows one strapping layer 85 in electrical communication with one landing pad 65 through one contact plug 45, it should be noted that a plurality of contact plugs 45 and landing pads 65 may be in electrical communication with the digit line 10 and the strapping layer 85 at a plurality of points to further reduce the resistance in series with the diodes 30. In addition, it should also be remembered that there are a plurality of digit lines formed along other cross sections.

In a method of a second embodiment diodes are formed, each having a maximum width equal to f, which is equal to the minimum photolithographic limit of the photolithographic equipment being used, and distanced one from the other along a length of the digit line by a maximum distance equal to f; at least portions of the diodes are masked; at least a portion of an fits insulative material interposed between two diodes is removed to expose the buried digit line; and the conductive plug is formed in contact with the exposed portion of the buried digit line. After the formation of a programmable resistor in series with the diode a wordline is formed in electrical communication with each of the programmable resistors, and an insulative layer is formed overlying each wordline. Next an insulative spacer layer is deposited and etched to expose the conductive plug. The strapping layer is then formed self-aligned to the conductive plug.

In this embodiment the diode and the plug are made of polycrystalline silicon, although it is possible that any conceivable diode structure may be used. In the second embodiment the P portion of the diode is fabricated in the substrate and the N portion is fabricated overlying the substrate.

In an enhancement of the second embodiment a buried digit line is strapped at each memory cell to reduce the series resistance thereby creating greater drive. The self alignment feature of the invention facilitates a denser array.

The second embodiment of the invention is depicted in FIGS. 9A–21B.

Figure 9A:
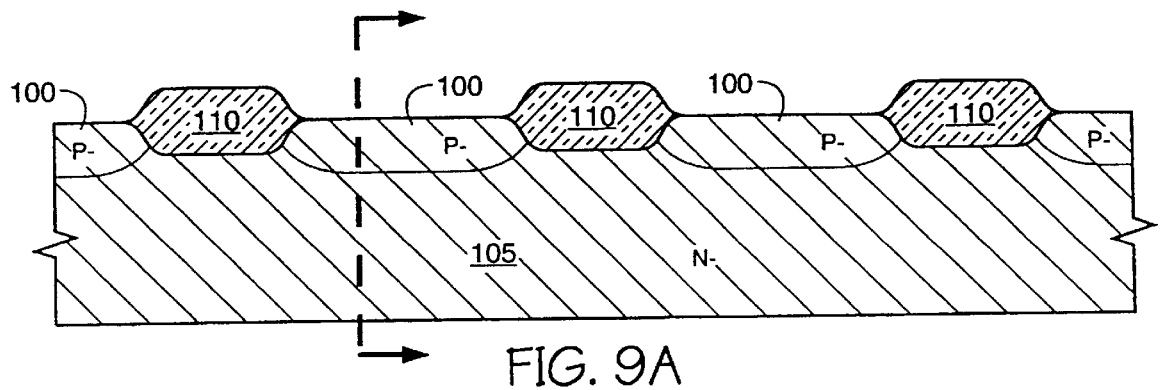
FIG. 9A is a cross sectional view of a substrate in which digit lines have been formed. The cross sectional view of FIG. 9A is taken through the width of the digit lines.

In FIG. 9A p– digit lines 100 have been formed in an n– substrate 105 according to methods known in the art. The present embodiment is shown with LOCOS isolation having field oxide regions 110, but is adapted to trench isolation and modified LOCOS.

Figure 9B:
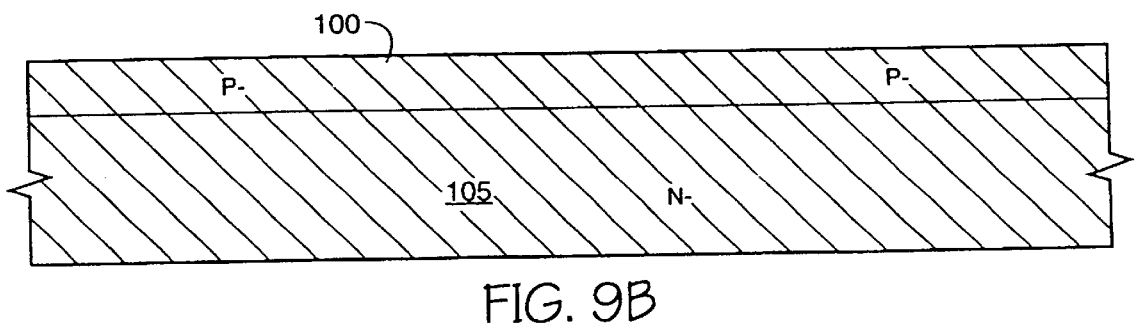
FIG. 9B is a cross sectional view taken through the length of one of the digit lines a shown in FIG. 9A.

FIG. 9B is a longitudinal cross section through the length of one of the digit lines 100 shown in lateral cross-section in FIG. 9A.

Figure 10A:
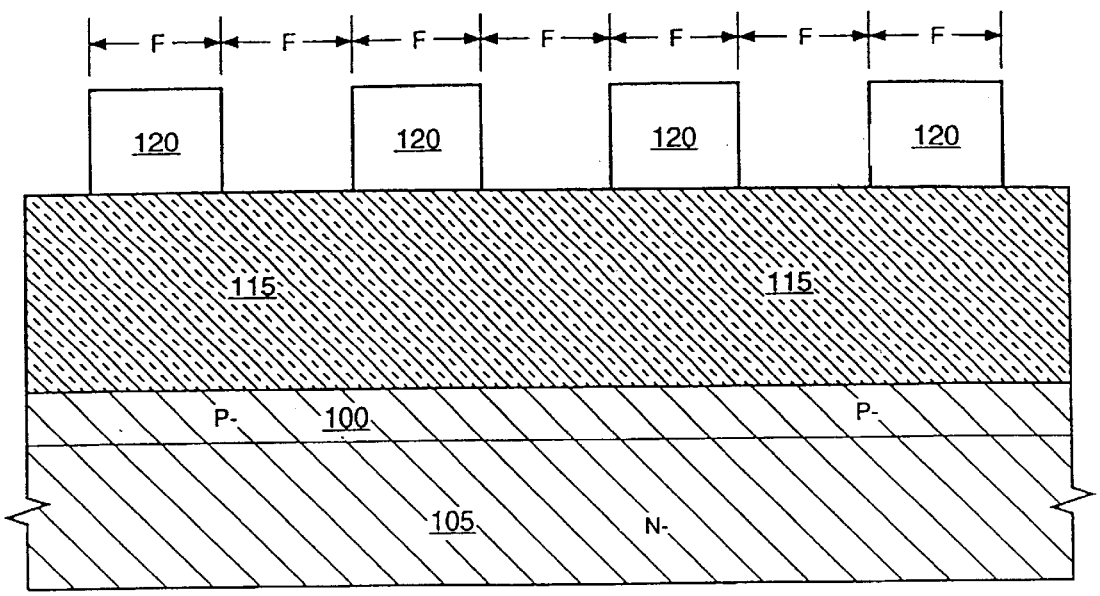
FIG. 10A is a cross sectional view of a the substrate of FIG. 9B following the deposition, planarization and masking of an oxide layer.

FIG. 10A is a cross sectional view of a the substrate of FIG. 9B following further process steps. In FIG. 10A a conformal silicon dioxide layer 115 is deposited and planarized, preferably with CMP. The depth of the silicon dioxide layer 115 is selected to be greater than the desired height off electrical contact plugs to digit lines 100. The silicon dioxide layer 115 is patterned with a photoresist mask 120 to define the electrical contact plugs. Openings are etched in the exposed portions of the silicon dioxide layer 115 to expose the digit lines 100. By using the method of the invention it is possible to have the minimum width of both the masked and unmasked regions along the length of the digit line equal to f. Thus the method of the invention allows the fabrication of a dense memory array.

Figure 10B:
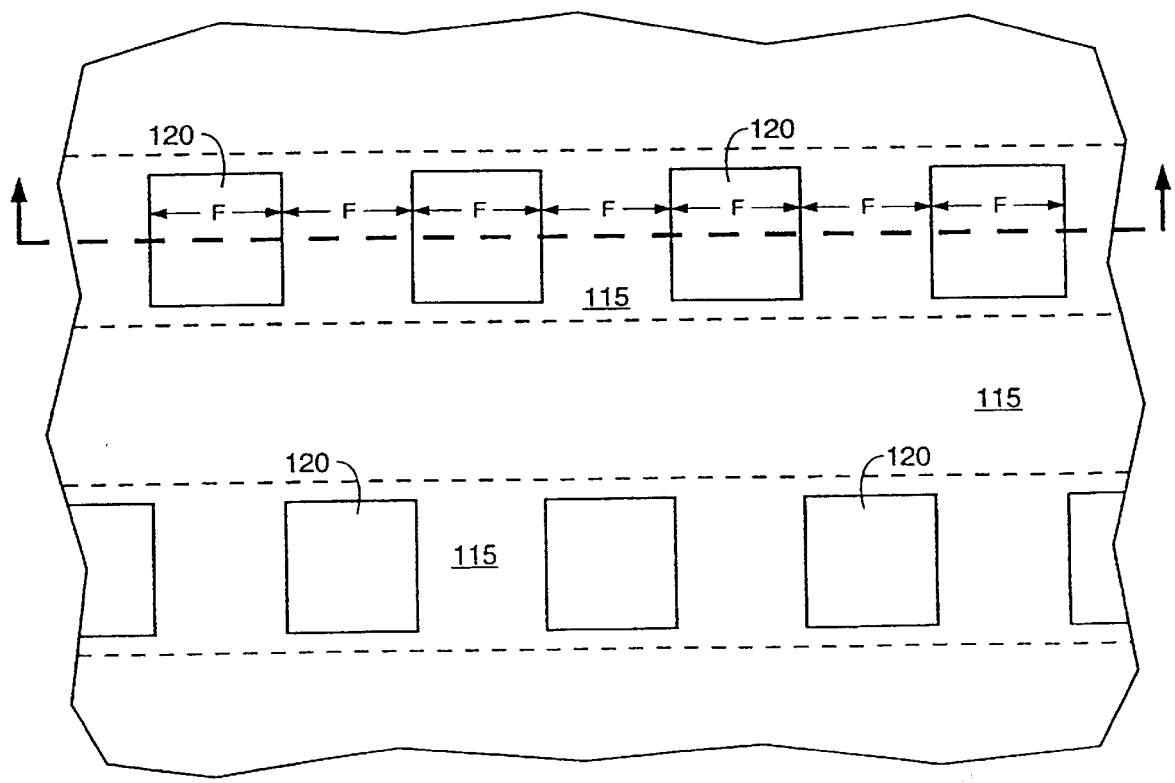
FIG. 10B is a top planar view of FIG. 10A.

FIG. 10B is a top planar view of the device of FIG. 10A. Since the digit lines underlie the photoresist mask 120 and silicon dioxide layer 115 they are outlined by dashed lines which also define active areas. The field oxide region underlies the silicon dioxide and lies between two digit lines.

Figure 11A:
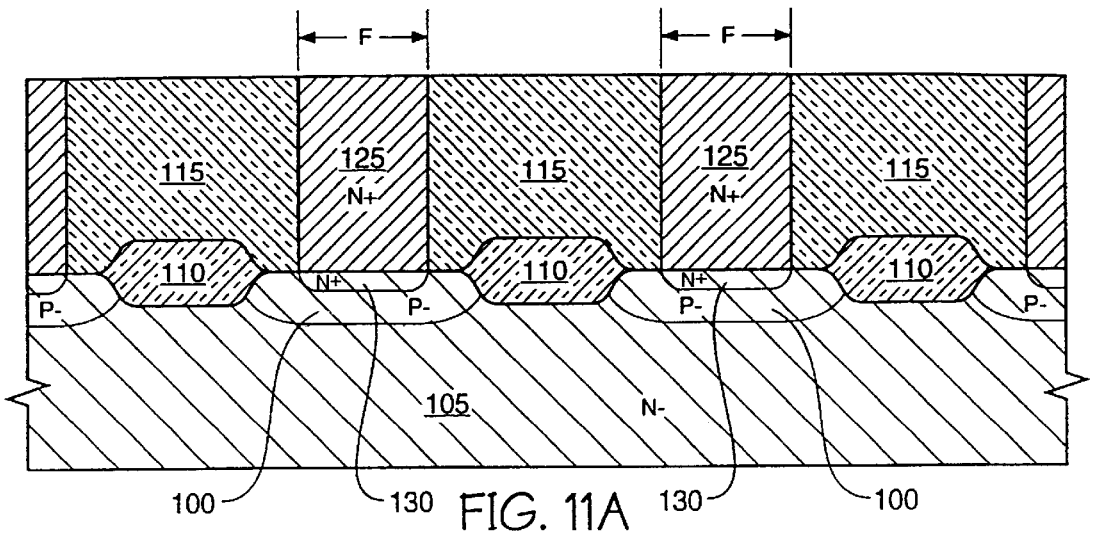
FIGS. 11A and 11B are the cross sectional views of FIGS. 9A and 9B, respectively, following the formation of polycrystalline silicon regions in the oxide layer of FIGS. 10A and 10B.
Figure 11B:
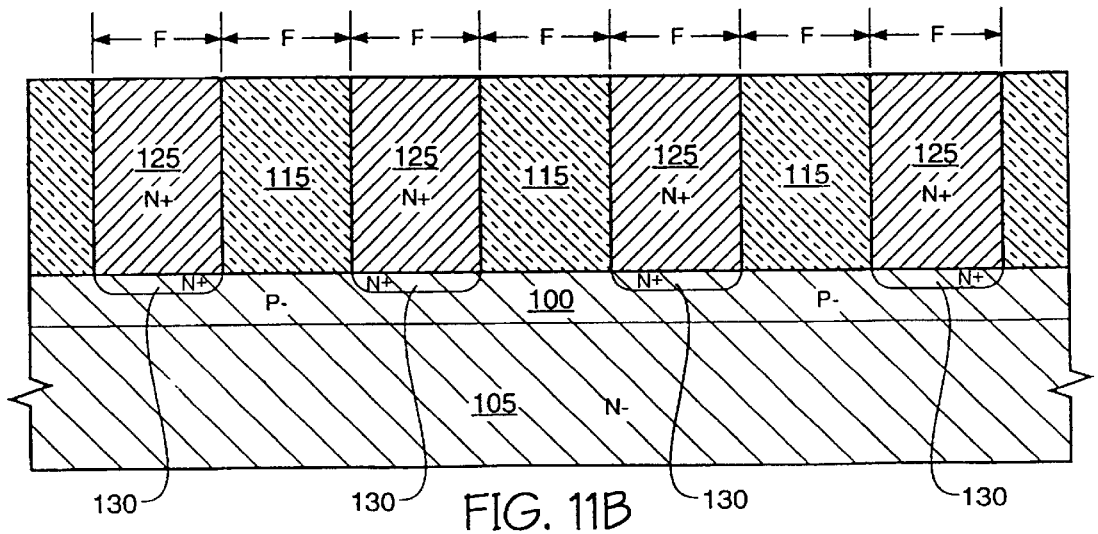

FIGS. 11A and 11B deposit the cross sectional views of FIGS. 9A and 9B, respectively, following further process steps. In FIGS. 11A and 11B the openings have been filled with N+ poly using standard fill techniques. The N+ poly is planarized preferably using CMP. The N+ poly forms contact plugs 125 to the digit lines 100, and the positive N+ electrode 130 of the diode is formed from out diffusion of the N type dopant from the N+ poly, thereby avoiding leakage current because the diode behaves as a single crystal diode.

Figure 12A:
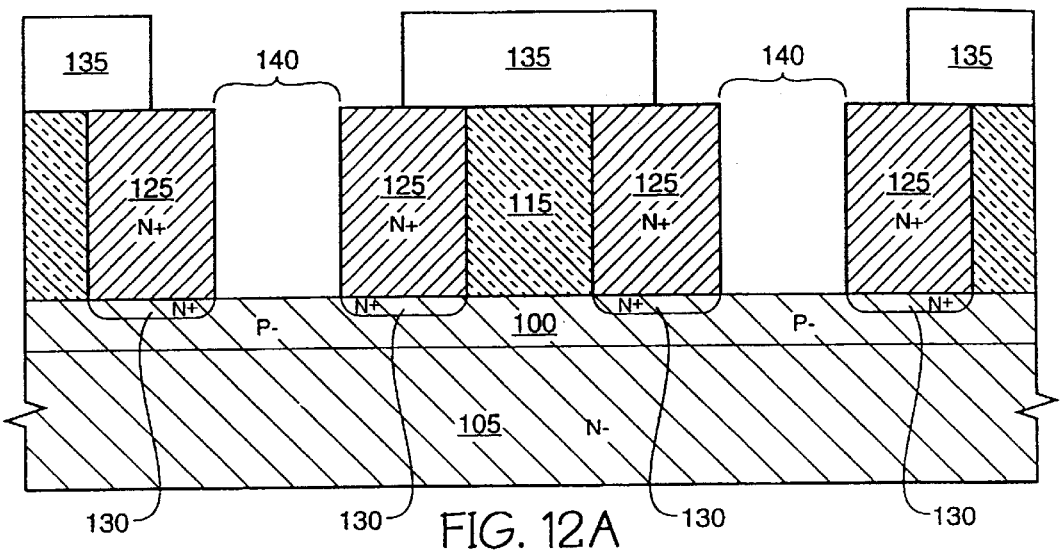
FIG. 12A is the cross sectional view of FIG. 11B following the masking of the polycrystalline silicon regions and the oxide layer and following the etching of the oxide layer in unmasked regions.
Figure 12B:
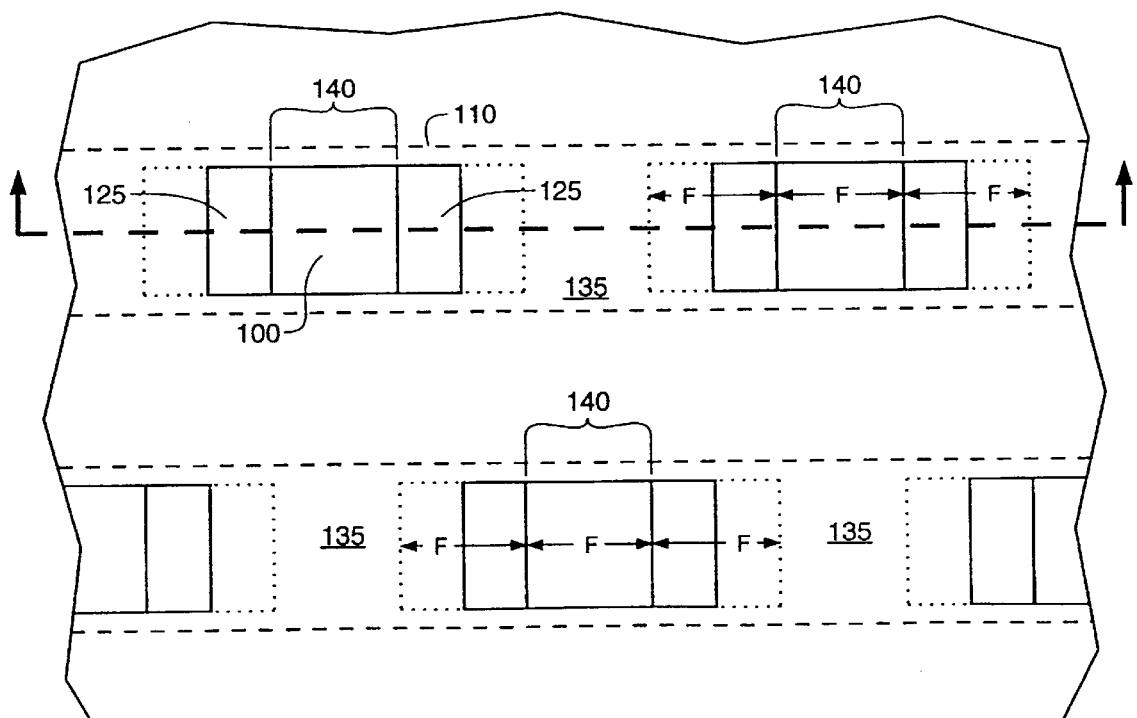
FIG. 12B is a top planar view of FIG. 12A.

FIG. 12A depicts the cross sectional view of FIG. 11B following further process steps, and FIG. 12B is a top planar view of the device of FIG. 12A. In FIGS. 12A and 12B the contact plugs 125 and silicon dioxide 115 shown in FIGS. 11A and 11B are patterned with a mask 135, and the silicon dioxide 115 is etched in unmasked areas to form openings 140 to expose the digit lines 100 in the unmasked areas. The mask 135 may be misaligned with the contact plugs 125 since the method creates self aligned openings between the contact plugs 125. In one embodiment each opening eventually allows the strapping layer to be in electrical contact to the digit line 100 at each memory cell thereby decreasing series resistance to allow for a higher programming current to adequately set the logic state of a chalcogenide material in an ovoric device which will be fabricated overlying each of the contact plugs 125.

However, the masking may be more selective in order to form fewer openings 140.

FIG. 12B, as in FIG. 10B, the digit lines have been outlined with dashed lines. In addition portions of contact plugs 125 underlying mask 135 are shown with dotted lines.

Figure 13:
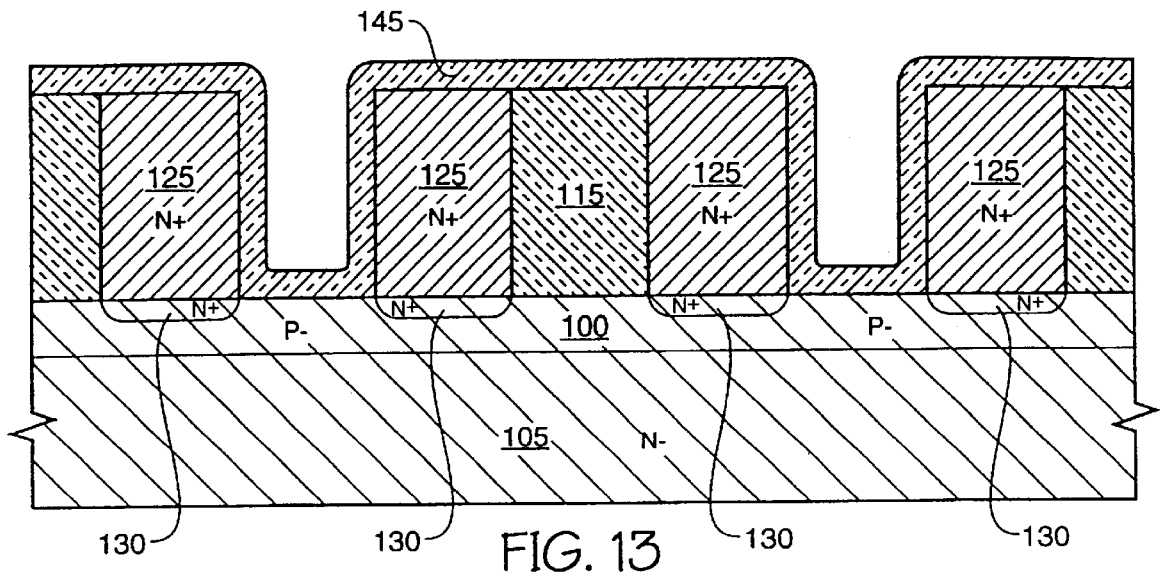
FIG. 13 is a cross sectional view of FIG. 12A following removal of a masking layer and deposition of a spacer layer.

FIG. 13 is a cross sectional view of FIG. 12A following further process steps. In FIG. 13 the mask 135 has been removed and an oxide spacer layer 145 deposited.

Figure 14:
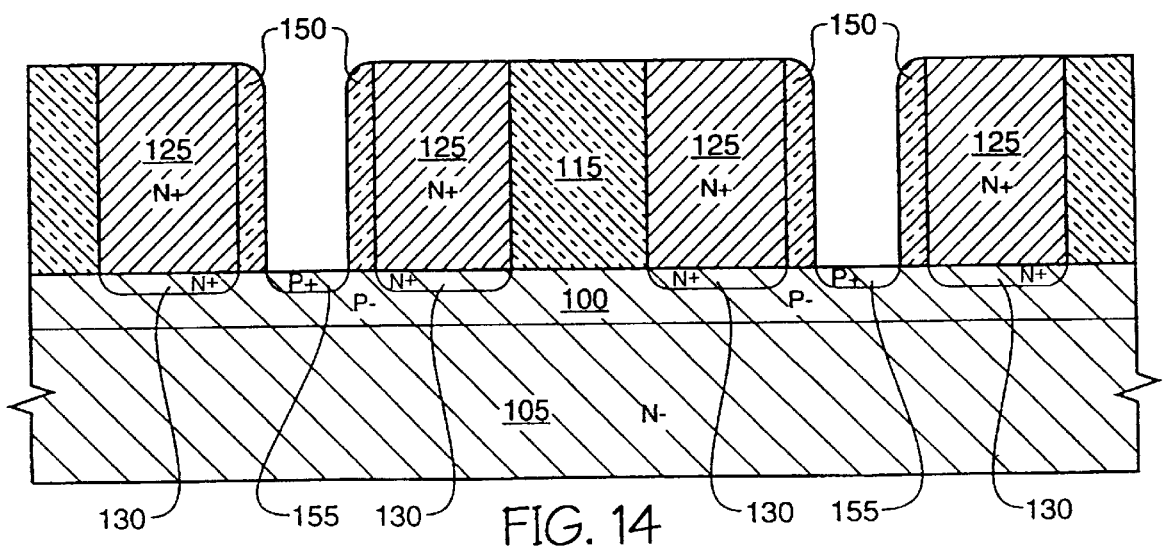
FIG. 14 is the cross sectional view of FIG. 13 following the etching of the spacer layer to form spacers adjacent to sidewalls of the polycrystalline silicon regions.

FIG. 14 is a cross sectional view of FIG. 13 following further process steps. In FIG. 14 the oxide spacer layer has been anisotropically dry etched to form spacers 150 on the sidewalls of the contact plug 125. A P+ region 155 is formed in the exposed portion of the digit line 100 during a shallow P+ implant, using a dopant from the group consisting of BF 2 and at an energy equal to 25–75 KeV and a dosage equal to $5B^{14}$–$5E^{15}$ atoms/cm$^2$, to lower the resistance of a future metal interconnect. During the implant it is necessary to protect the ni+ contact plug 125 with some form of mask (not shown) such as a hand mask.

Figure 15:
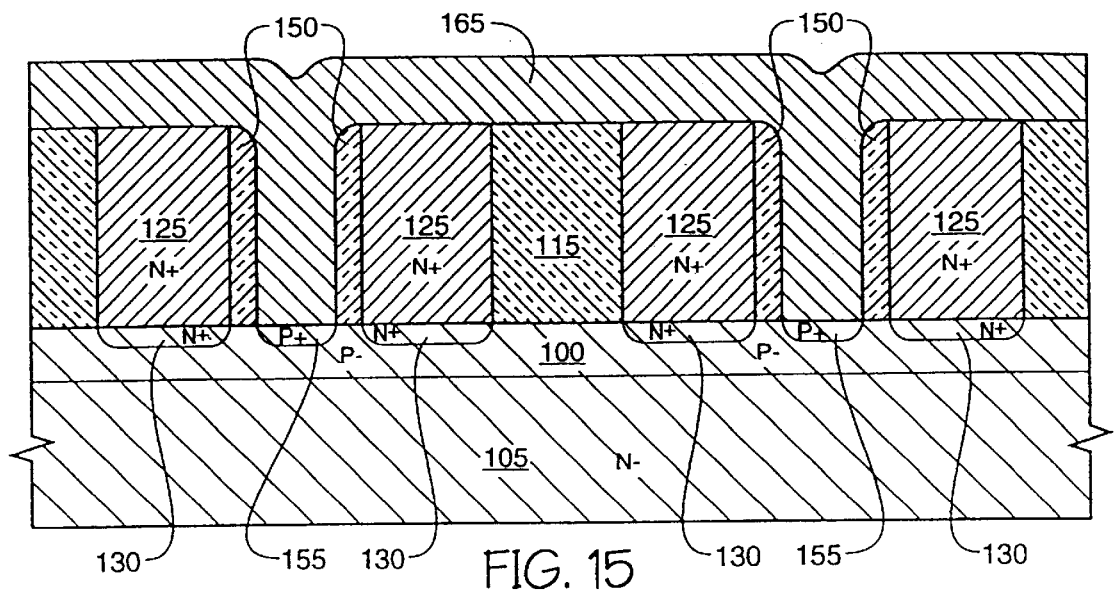
FIG. 15 is the cross sectional view of FIG. 14 following a deposition of polycrystalline silicon.

FIG. 15 is a cross sectional view of FIG. 14 following further processing steps. In FIG. 15 a layer of polycrystalline silicon 165 is deposited.

Figure 16:
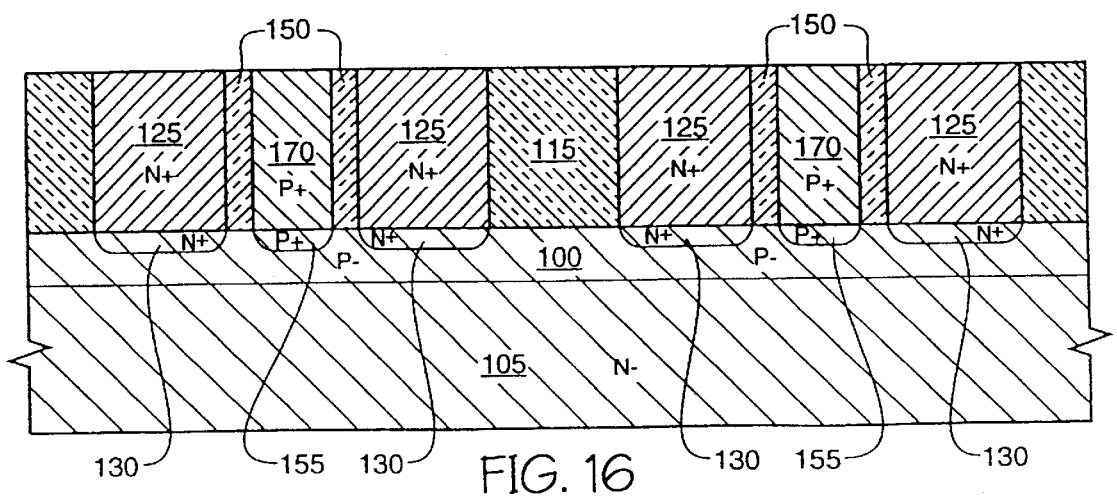
FIG. 16 is the cross sectional view of FIG. 15 following a CMP.

FIG. 16 is a cross sectional view of FIG. 15 following further processing steps. In FIG. 16 the contact plugs 125, spacers 150, and polycrystalline silicon 165 are CMPed to create a planar surface and to eliminate portions of spacer 150 having non uniform thicknesses. The spacers 150 following the CNP process provide greater isolation properties than did the spacers existing before CMP.

The polycrystalline silicon layer 165 forms a planar landing pad 170 following the CMP. A digit line strapping layer may be fabricated overlying the landing pad 170 as is explained below. The polycrystalline silicon 165 is doped P+ using a P+ implant subsequent to the planarization step.

Figure 17A:
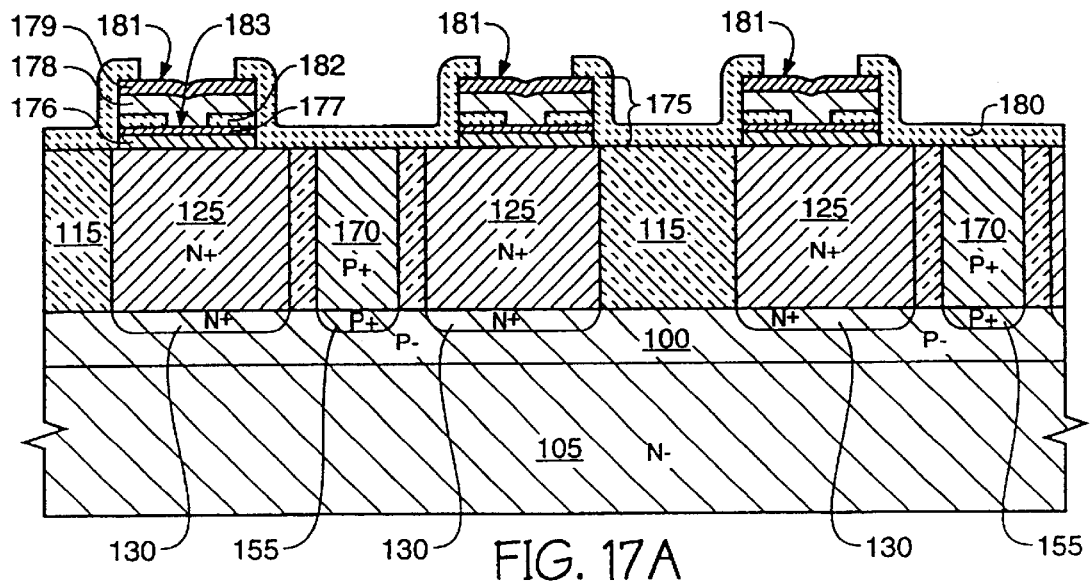
FIG. 17A is the cross sectional view of FIG. 16 following the formation of ovonic devices.

In one alternate embodiment which is shown in FIG. 17A the contact plugs 125 are fabricated to be larger than the photolithographic limit. FIG. 17A is similar to FIG. 16 except that the contact plugs 125 are larger and further processing steps have been performed. An ovonic device 175 is fabricated overlying each of the contact plugs 125 according to a method of layer fill and etching back according to a pattern (not shown) defining the ovonic device 175. The width of the ovonic device may be as small as the photolithographic limit thereby allowing more access to the landing pad 170. In this embodiment the ovonic device consists of the following layers: tungsten 176, a lower TiN or TiC$_x$N$_y$ layer 177, a nitride layer 182, a chalcogenide layer 178, and an upper TiN layer 179. A pore opening 183 is created in the nitride layer 182 and the chalcogenide layer 178 fills the pore opening 183. In this method the chalcogenide material is applied using conventional thin film deposition methods and the other materials of the ovonic devices 175 are formed with various methods of layering and etching.

Typical chalcogenide compositions for these memory cells include average concentrations of Te in the amorphous state well below 70%, typically below about 60% and ranging in general from as low as about 23% up to about 56% Te, and most preferably to about 48% to 56% Te. Concentrations of Ge are typically above about 15% and range from a low of about 17% to about 44% average, remaining generally below 50% Ge, with the remainder of the principal constituent elements in this class being Sb. The percentages given are atomic percentages which total 100% of the atoms of the constituent elements. In a particularly preferred embodiment, the chalcogenide compositions for these memory cells comprise a Te concentration of about 55%, a Ge concentration of about 22%, and a Sb concentration of about 22%. This class of materials are typically characterized as Te$_a$Ge$_b$Sb$_{100(a+b)}$, where a is equal to or less than about 70% and preferably between about 60% to about 40%, b is above about 15% and less than 50%, preferably between about 17% to about 44%, and the remainder is Sb.

An electrically insulative nitride layer 180 is deposited overlying the ovonic device 190. The nitride layer is patterned in order to expose at least a portion of the upper surface 181 of the ovonic device 175.

Figure 17B:
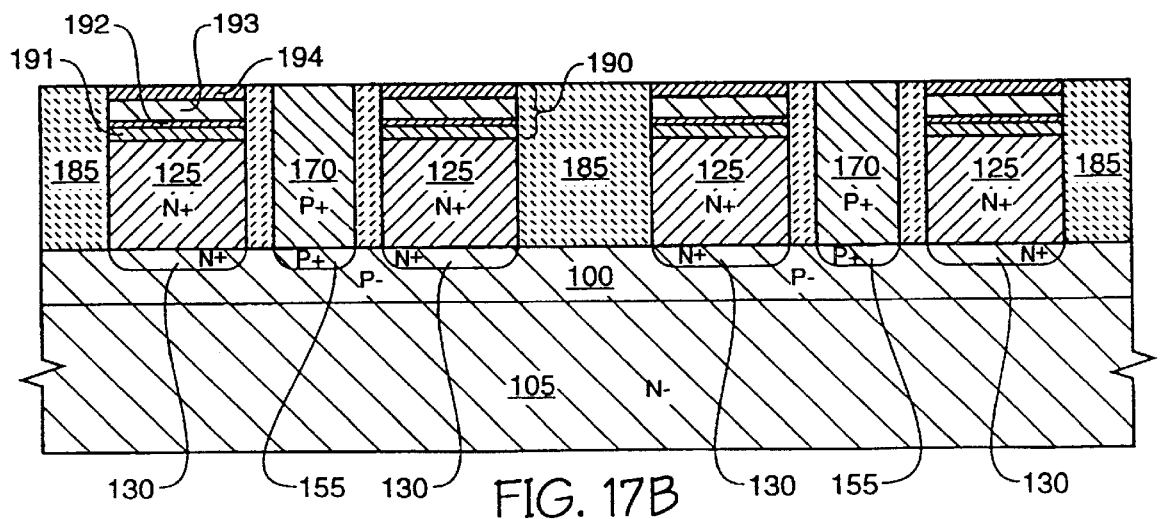
FIG. 17B is the cross sectional view of FIG. 16 following the formation of ovonic devices in a recess of a nitride layer.

FIG. 17B is a cross sectional view of FIG. 16 following further processing steps. An ovonic device 190 is fabricated by a second method. When using the second method it is necessary to deposit a nitride layer 185 or a combination silicon dioxide layer with an overlying nitride layer instead of the silicon dioxide layer 115, openings (not shown) are etched partially into the nitride layer 185 or the nitride of the nitride-silicon dioxide combination layer. Recessed ovonic devices 190 are then fabricated in the openings overlying the contact plugs 125. The fabrication comprises a layering, which includes deposition fill and etching back, of the following materials in the sequential order in which they are written: tungsten 191, a lower TiC$_x$N$_y$ layer 192, chalcogenide layer 193, and an upper TiC$_x$N$_y$ layer 194. By using this method the chalcogenide material fills the hole without patterning.

Figure 18A:
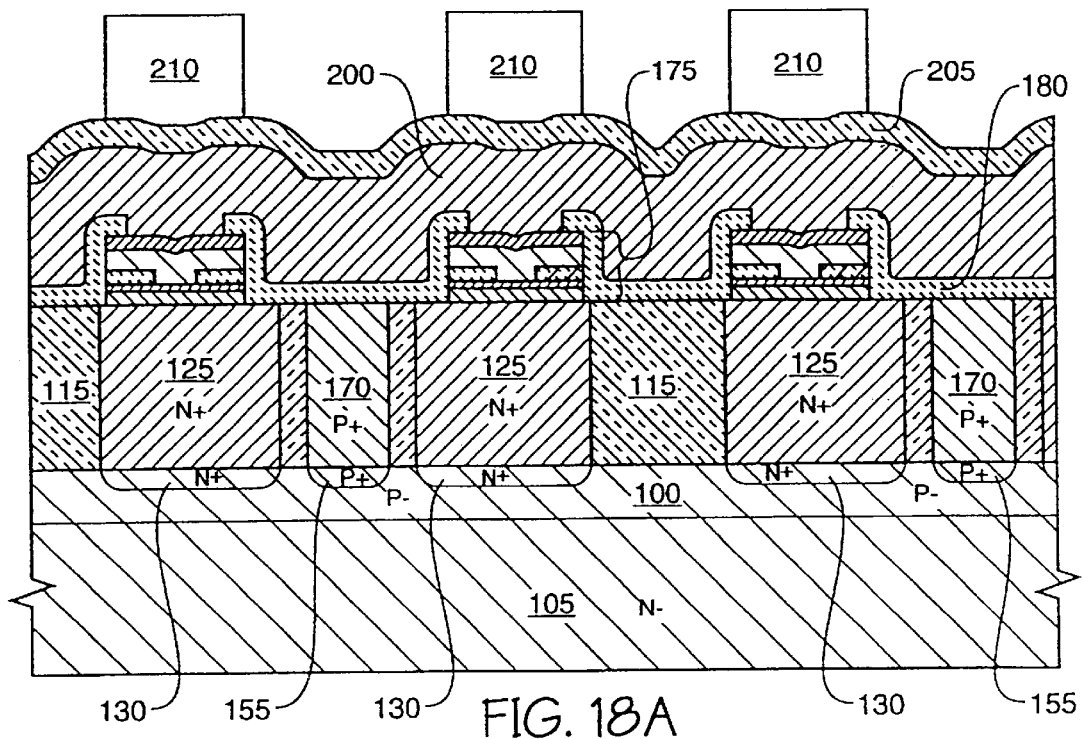
FIGS. 18A and 18B are the cross sectional views of FIGS. 17A and 17B, respectively, following the deposition of a conductive layer and an oxide layer and the masking thereof.
Figure 18B:
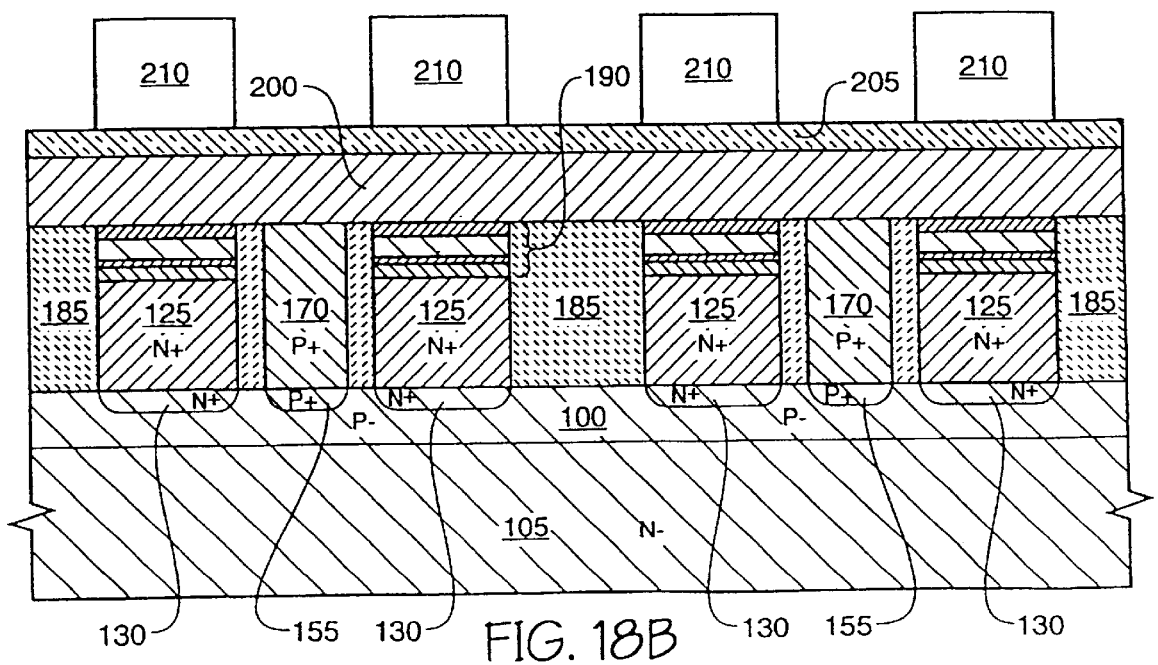
Figure 19A:
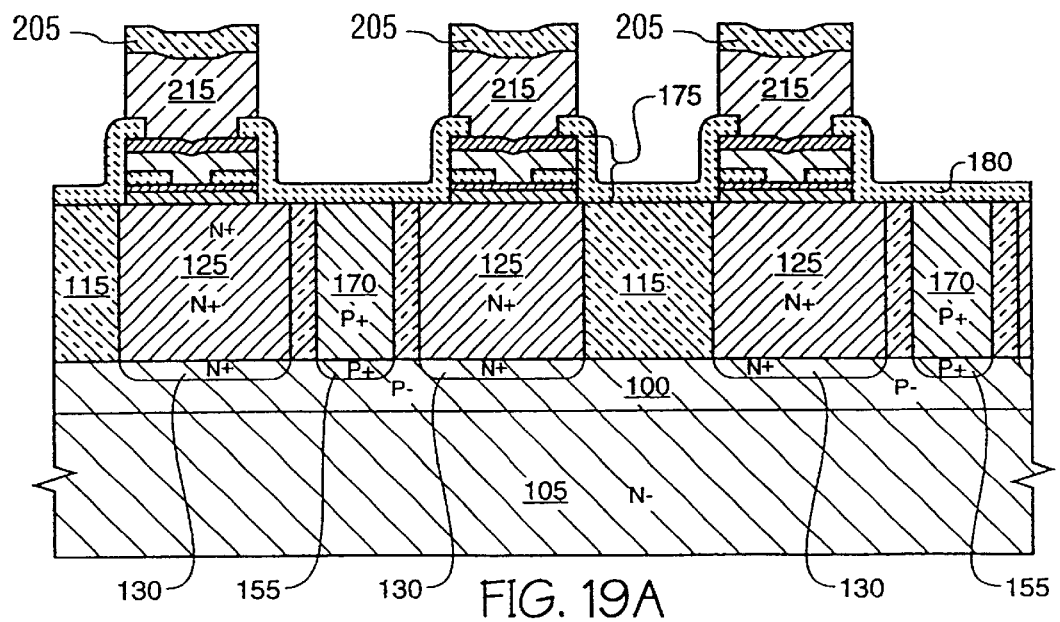
FIGS. 19A and 19B are the cross sectional views of FIGS. 18A and 18B, respectively, following removal of exposed portions of the conductive layer and the oxide layer and the mask of FIGS. 18A and 18B.
Figure 19B:
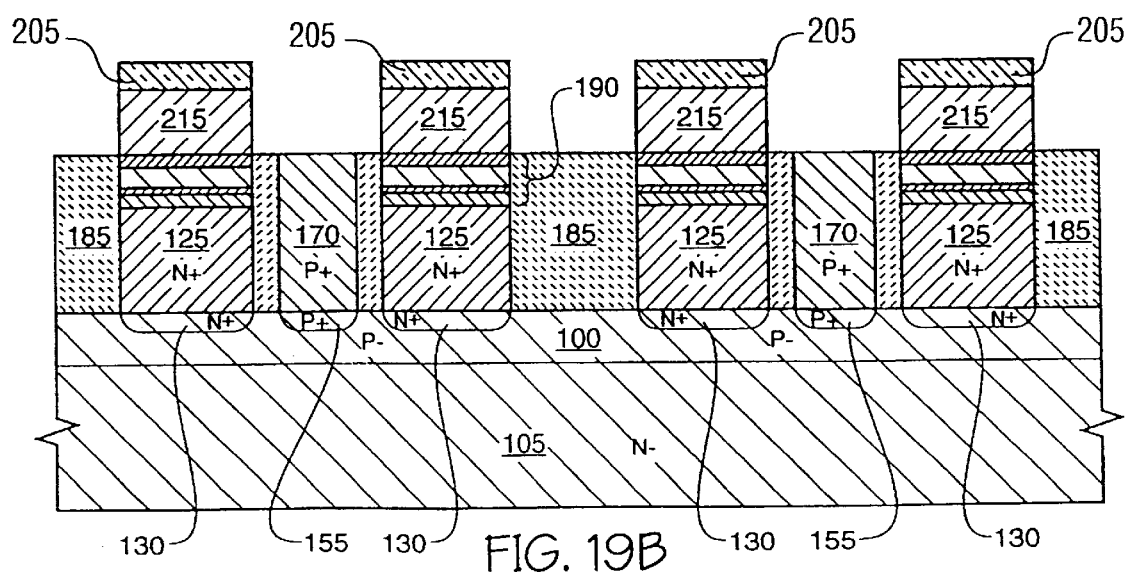

Next wordlines are created. FIGS. 18A and 18B are the cross sectional views of FIGS. 17A and 17B, respectively, following the formation of a conformal conductive layer 200 in electrical contact with the ovonic devices 175 and 190, respectively. Typically the conductive layer 200 is a deposit of aluminum, copper, gold, silver, or refractory metals. An oxide layer 205 is then formed overlying the conductive layer 200. The wordlines are patterned with a mask 210 overlying the oxide layer 205, and exposed portions of the oxide layer 205 are removed during a first etch, and then exposed portions of the conductive layer 200 are removed during a second etch. The portions of the conductive layer 200 remaining subsequent to the etch form the word lines 215, see FIGS. 19A and 19B, respectively.

Figure 20A:
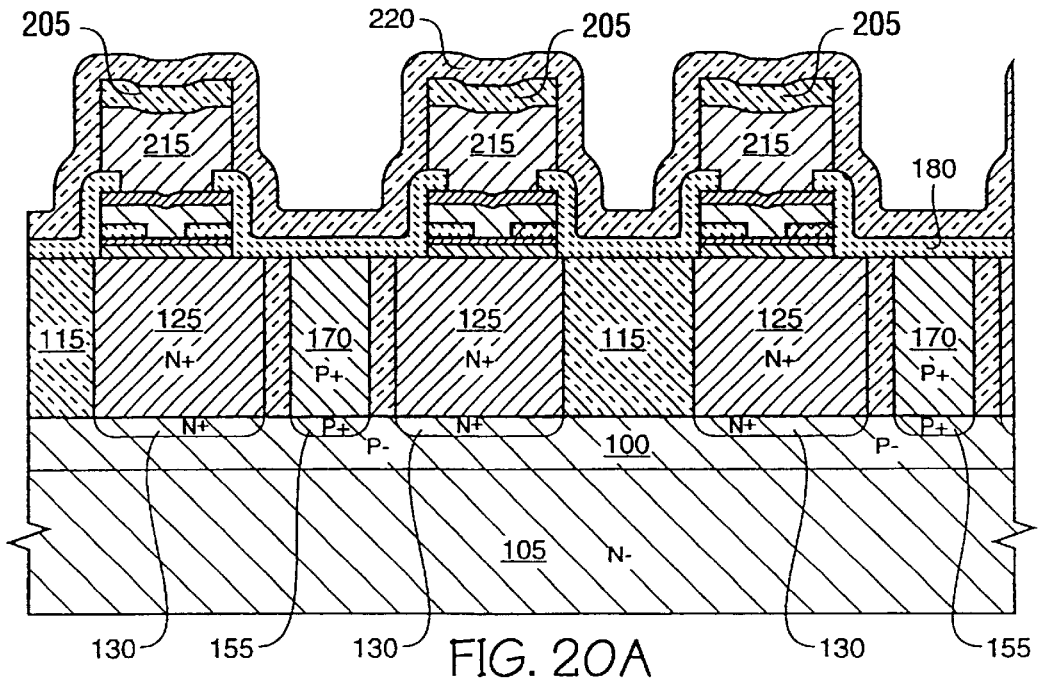
FIGS. 20A and 20B are the cross sectional views of FIGS. 19A and 19B, respectively, following the deposition of an oxide layer.
Figure 20B:
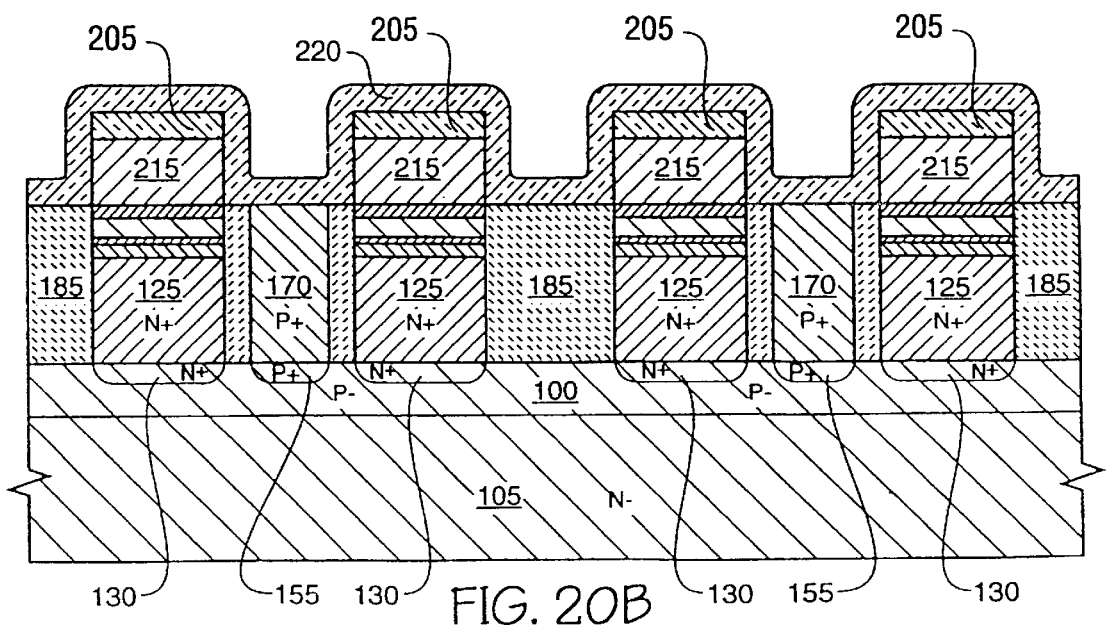

The mask is then removed, and a conformal oxide layer 220 is deposited, see FIGS. 20A and 20B, respectively.

Figure 21A:
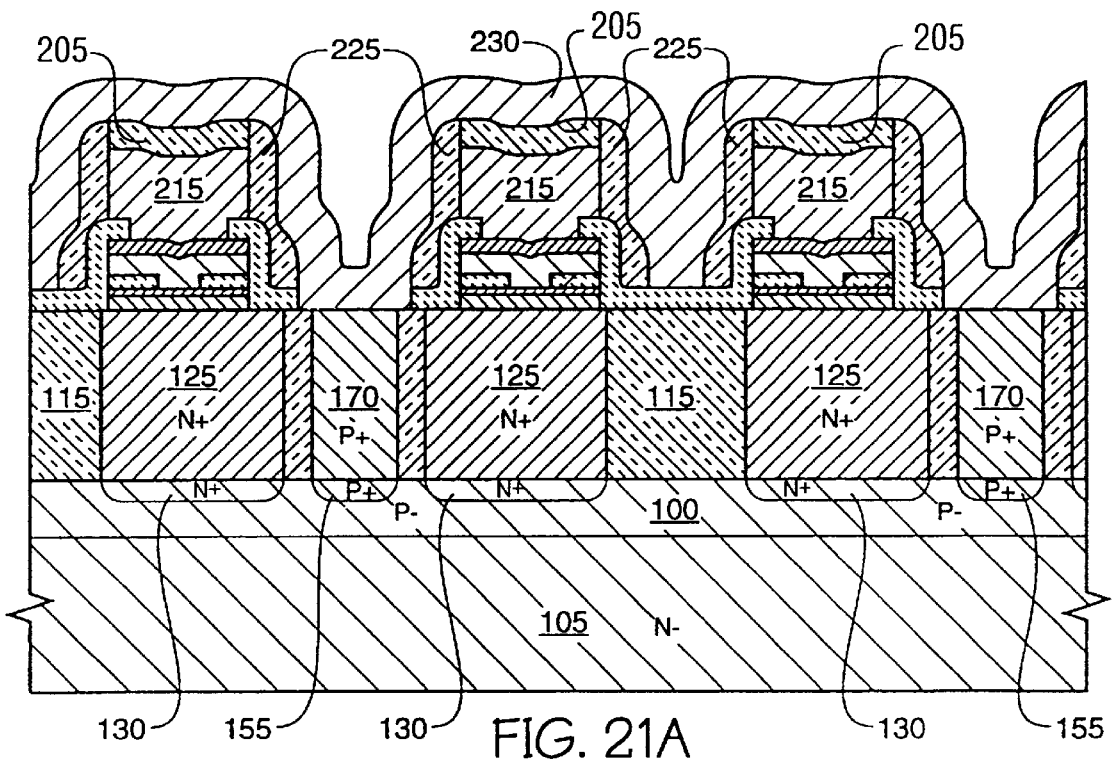
FIGS. 21A and 21B are the cross sectional views of FIGS. 20A and 20B, respectively, following etching of the oxide layer of FIGS. 20A and 20B and the deposition of a strapping layer.
Figure 21B:
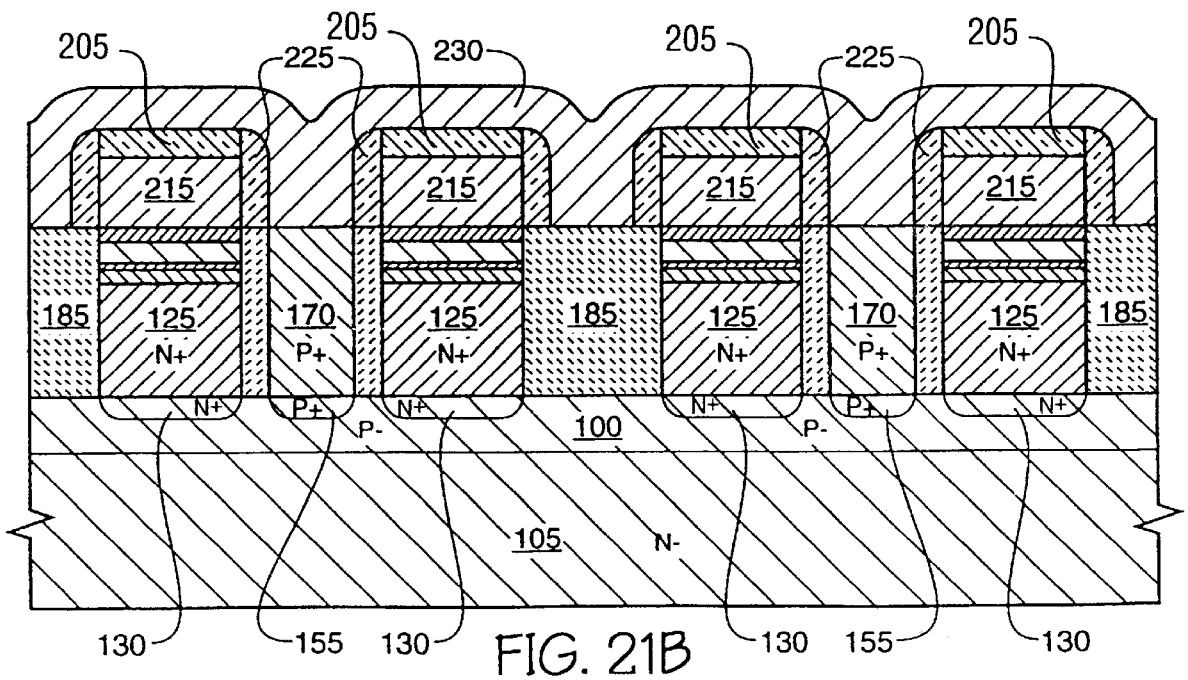

In FIGS. 21A and 21B an oxide spacer 225 is formed to electrically insulate the wordlines 215 from a future strapping layer. The spacer 225 is formed by anisotropically etching of the oxide layer 220. The etch of the oxide layer 220 exposes the landing pads 170 in FIG. 21B. In addition to the oxide layer 220 the nitride layer 180, in FIG. 21A, is etched to expose the landing pads 170 shown in FIG. 21A.

Further shown in FIGS. 21A and 21B is the strapping layer 230, typically aluminum, copper, or other conductive material, deposited in contact with the landing pad 170. The strapping layer is in electrical communication with the digit line 100 through the landing pad 170. Typically the strapping layer 230 is patterned to define desired interconnects and then etched according to the pattern. The photoresist (not shown) used for patterning is then removed and the metal is alloyed.

The invention provides redundancy since the digit line is a buried component and the strapping layer is an upper component. Thus, even if the metal of the strapping layer breaks, operation of the memory device is maintained through the buried digit line. Thus the device has better electromigration reliability, and there is no memory disturbance from cell to cell due to the collection of current in the digit line.

There is space savings when using the structure of the second embodiment, since the area between cells is no longer just isolation space but is used instead for contact to the buried digit. line, thereby providing efficient spacing of the cell for high compaction while at the same time providing good cell to cell isolation.

By using the double metal scheme of the invention the series resistance to the diode is reduced to the diode/programmable resistor structure. This resistance is decreased even further by providing a strapped conductive plug for every two diodes of the array and physically interposed therebetween. By using titanium silicide on the buried digit line in conjunction with the strapped metal layer the best packing density is achieved with minimal processing steps.

It should be noted that opposite doping may be used throughout the described embodiments without departing from the scope of the invention.

While the invention is susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the appended claims.

What is claimed is:

1. A method of fabricating a memory device comprising the acts of:
    (a) forming a first digit line on a substrate;
    (b) forming a plurality of pairs of memory cells in electrical communication with the first digit line;
    (c) forming a plurality of contacts in electrical communication with the first digit line, a respective one of the plurality of contacts being formed between each pair of memory cells; and
    (d) forming a strapping line in electrical communication with each of the plurality of contacts.

2. The method, as set forth in claim 1, wherein act (a) comprises the act of:
    forming a titanium silicide layer over the first digit line.

3. The method, as set forth in claim 1, wherein act (b) comprises the acts of:
    for each of the memory cells, forming an access device having a first terminal and a second terminal, the first terminal being in electrical communication with the first digit line; and
    for each of the memory cells, forming a memory element in electrical communication with the second terminal of the access device.

4. The method, as set forth in claim 1, wherein act (b) comprises the act of:
    forming each of the memory cells to have a width approximately equal to a minimum photolithographic limit.

5. The method, as set forth in claim 1, wherein act (c) comprises the act of:
    forming each contact from a doped semiconductive region of the substrate.

6. The method, as set forth in claim 1, wherein act (c) comprises the acts of:
    forming dielectric spacers between each pair of memory cells; and
    forming each contact between the respective dielectric spacers.

7. The method, as set forth in claim 1, wherein act (d) comprises the act of:
    isolating each of the plurality of memory cells from the plurality of contacts.

8. The, method, as set forth in claim 1, comprising the act of:
    forming a plurality of second digit lines, each of the plurality of second digit lines being in electrical communication with a respective one of the plurality of memory cells.

9. The method, as set forth in claim 3, wherein the act of forming an access device comprises the act of:
    forming a diode.

10. The method, as set forth in claim 3, wherein the act of forming a memory element comprises the act of:
    forming a chalcogenide memory element.

11. The method, as set forth in claim 4, wherein act (b) comprises the act of:
    forming each pair of memory cells to be spaced apart by a distance approximately equal to the minimum photolithographic limit.

12. The method, as set forth in claim 6, wherein each contact and its respective dielectric spacers have a combined width approximately equal to a minimum photolithographic limit.

13. The method, as set forth in claim 7, wherein the act of isolating comprises the act of:
    disposing dielectric material on each of the plurality of memory cells.

14. The method, as set forth in claim 13, wherein act (d) comprises the act of:
    forming the strapping line through tapered holes extending through the dielectric material to the contacts.

* * * * *